(12) United States Patent
Lee et al.

(10) Patent No.: US 9,909,197 B2
(45) Date of Patent: Mar. 6, 2018

(54) SUPPORTING UNIT AND SUBSTRATE TREATING APPARATUS INCLUDING THE SAME

(71) Applicant: Semes Co., Ltd., Cheonan-si, Chungcheongnam-do (KR)

(72) Inventors: Wonhaeng Lee, Cheonan-si (KR); Kang Rae Ha, Hwasun-gun (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 14/974,023

(22) Filed: Dec. 18, 2015

(65) Prior Publication Data

US 2016/0181137 A1    Jun. 23, 2016

(30) Foreign Application Priority Data

Dec. 22, 2014  (KR) .................. 10-2014-0186104
Sep. 30, 2015  (KR) .................. 10-2015-0137803

(51) Int. Cl.
*B23K 31/02*    (2006.01)
*C22C 29/12*    (2006.01)
(Continued)

(52) U.S. Cl.
CPC ............ *C22C 29/12* (2013.01); *B23K 35/286* (2013.01); *B23K 35/325* (2013.01); *B32B 15/00* (2013.01); *C22C 29/02* (2013.01); *C22C 49/06* (2013.01); *C22C 49/14* (2013.01); *H01J 37/32568* (2013.01); *H01J 37/32715* (2013.01);
(Continued)

(58) Field of Classification Search
CPC ... C22C 29/12; C22C 29/02; H01L 21/67103; H01L 21/6831; H01L 21/67109; H01L 21/68785; H01L 21/68757; H01J 37/32715; H01J 37/32724; H01J 37/32568;
(Continued)

(56) References Cited

U.S. PATENT DOCUMENTS 2,124,438 A * 7/1938 Struk .................. B23K 31/025
                                                   407/118
2,421,607 A * 6/1947 Fowler .................... G03F 7/12
                                                   101/128.21
(Continued)

FOREIGN PATENT DOCUMENTS

CN       104600019 A      5/2015
DE       19953760 C1 *    7/2001  ............. B23K 1/012
(Continued)

OTHER PUBLICATIONS

Machine translation of JP 2002141402 A (no date available).*
Machine translation of JP H10041377 (no date available).*

*Primary Examiner* — Kiley Stoner
(74) *Attorney, Agent, or Firm* — Harness, Dickey & Pierce, P.L.C.

(57) ABSTRACT

A fabrication method of a supporting unit supporting a substrate is provided. The fabrication method includes providing a supporting plate that is made of a non-conductive material and configured to support the substrate, providing a base plate that is disposed under the supporting plate and made of a material containing a conductive material, and forming a first metal film on a top surface of the base plate and bonding the supporting plate with the base plate through a brazing process.

10 Claims, 5 Drawing Sheets

(51) Int. Cl.

| | |
|---|---|
| *H02N 13/00* | (2006.01) |
| *B23K 35/32* | (2006.01) |
| *B23K 35/28* | (2006.01) |
| *C22C 29/02* | (2006.01) |
| *H01J 37/32* | (2006.01) |
| *H01L 21/67* | (2006.01) |
| *H01L 21/683* | (2006.01) |
| *H01L 21/687* | (2006.01) |
| *B32B 15/00* | (2006.01) |
| *C22C 49/06* | (2006.01) |
| *C22C 49/14* | (2006.01) |

(52) U.S. Cl.
CPC .. *H01J 37/32724* (2013.01); *H01L 21/67103* (2013.01); *H01L 21/67109* (2013.01); *H01L 21/6831* (2013.01); *H01L 21/68757* (2013.01); *H01L 21/68785* (2013.01); *H02N 13/00* (2013.01)

(58) Field of Classification Search
CPC .............. B23K 35/325; B23K 35/286; B23K 1/00–1/206; B23K 2203/10; H02N 13/00
USPC ........ 228/245–255, 262.51, 44.3, 44.7, 47.1, 228/49.1, 49.5
See application file for complete search history.

(56) References Cited

U.S. PATENT DOCUMENTS

| | | | | |
|---|---|---|---|---|
| 2,530,552 A * | 11/1950 | Stoddard, Jr. | ......... | B23K 1/0008 204/286.1 |
| 3,284,891 A * | 11/1966 | Whitney | ............ | B23K 35/3006 156/89.28 |
| 5,043,229 A * | 8/1991 | Mizuhara | ............ | C04B 37/006 228/124.5 |
| 5,155,652 A * | 10/1992 | Logan | ............... | H01L 21/6831 279/128 |
| 5,191,506 A * | 3/1993 | Logan | ............... | H01L 21/6831 269/8 |
| 5,874,178 A * | 2/1999 | Takayasu | ............ | B23K 35/004 228/175 |
| 5,968,273 A * | 10/1999 | Kadomura | ............ | C23C 16/14 118/715 |
| 6,087,596 A * | 7/2000 | Liu | ............... | B23K 1/008 174/260 |
| 6,095,400 A * | 8/2000 | Liu | ............... | B23K 35/0222 228/246 |
| 6,106,960 A * | 8/2000 | Fujii | ............... | C04B 37/006 228/124.5 |
| 6,126,061 A * | 10/2000 | Poggi | ............... | B64D 45/02 228/173.1 |
| 6,280,584 B1 | 8/2001 | Kumar et al. | | |
| 6,490,146 B2 * | 12/2002 | Wang | ............... | C04B 37/006 361/103 |
| 6,563,686 B2 * | 5/2003 | Tsai | ............... | C23C 16/4586 361/234 |
| 7,175,737 B2 * | 2/2007 | Sago | ............... | B23Q 3/154 118/724 |
| 7,270,885 B1 * | 9/2007 | Karandikar | .......... | B23K 35/286 428/446 |
| 7,337,745 B1 * | 3/2008 | Komino | ............... | H01L 21/6831 118/723 E |
| 8,129,016 B2 * | 3/2012 | Kawajiri | ............ | H01L 21/6833 428/214 |
| 8,684,256 B2 * | 4/2014 | Elliot | ............... | B23K 1/0008 228/121 |
| 9,623,504 B2 * | 4/2017 | Park | ............... | B23K 1/0018 |
| 2002/0050246 A1 * | 5/2002 | Parkhe | ............ | H01L 21/67109 118/500 |
| 2003/0030960 A1 * | 2/2003 | Kanno | ............... | H01L 21/67109 361/234 |
| 2003/0155409 A1 * | 8/2003 | Dockus | ............... | B23K 35/002 228/245 |
| 2004/0035910 A1 * | 2/2004 | Dockus | ............... | B23K 35/002 228/56.3 |
| 2005/0045104 A1 * | 3/2005 | Arai | ............... | H01J 37/32082 118/724 |
| 2005/0219786 A1 * | 10/2005 | Brown | ............... | H01L 21/6831 361/234 |
| 2006/0027625 A1 * | 2/2006 | Dockus | ............... | B23K 35/282 228/56.3 |
| 2006/0254830 A1 * | 11/2006 | Radtke | ............... | E21B 10/5735 175/426 |
| 2007/0217117 A1 * | 9/2007 | Ohta | ............... | H02N 13/00 361/234 |
| 2007/0221649 A1 * | 9/2007 | Ohta | ............... | H01L 21/67103 219/385 |
| 2010/0187290 A1 * | 7/2010 | Holi | ............... | B23K 1/0008 228/119 |
| 2010/0326957 A1 * | 12/2010 | Maeda | ............... | H01J 37/20 216/67 |
| 2011/0096507 A1 * | 4/2011 | Deram | ............... | H01L 23/3733 361/718 |
| 2012/0111928 A1 * | 5/2012 | Park | ............... | B23K 1/0018 228/245 |
| 2012/0164468 A1 * | 6/2012 | Kawamura | ............ | B32B 15/14 428/545 |
| 2012/0261104 A1 * | 10/2012 | Kelly | ............... | B23K 1/0012 165/177 |
| 2014/0020823 A1 * | 1/2014 | Montross | ............ | B23K 31/02 228/121 |
| 2014/0069585 A1 * | 3/2014 | Aoto | ............... | H01L 21/6831 156/345.52 |
| 2015/0008253 A1 * | 1/2015 | Yoon | ............... | B23K 20/026 228/179.1 |
| 2015/0090773 A1 * | 4/2015 | Schick | ............... | B23K 1/19 228/165 |
| 2015/0298232 A1 * | 10/2015 | Herrmann | ............ | B23K 1/008 228/180.1 |
| 2016/0271674 A1 * | 9/2016 | Huang | ............... | B21H 8/005 |
| 2016/0375515 A1 * | 12/2016 | Xu | ............... | B23K 1/0008 428/623 |

FOREIGN PATENT DOCUMENTS

| | | | | |
|---|---|---|---|---|
| JP | 03111564 A * | 5/1991 | | |
| JP | H10032239 | 2/1998 | | |
| JP | H10041377 | 2/1998 | | |
| JP | 11176919 A * | 7/1999 | | |
| JP | 2001110884 A * | 4/2001 | | |
| JP | 2002141402 A * | 5/2002 | | |
| KR | 2000-0032369 A | 6/2000 | | |
| KR | 10-0945270 B1 | 3/2010 | | |
| KR | 20100103611 A | 9/2010 | | |
| WO | WO 2010089647 A1 * | 8/2010 | ............. | B22F 7/006 |

* cited by examiner

SUPPORTING UNIT AND SUBSTRATE TREATING APPARATUS INCLUDING THE SAME

CROSS-REFERENCE TO RELATED APPLICATION(S)

This application claims the benefit under 35 U.S.C. § 119(a) of a Korean patent application filed on Dec. 22, 2014 in the Korean Intellectual Property Office and assigned Serial number 10-2014-0186104 and Sep. 30, 2015 in the Korean Intellectual Property Office and assigned Serial number 10-2015-0137803, the entire disclosure of which is hereby incorporated by reference.

TECHNICAL FIELD

The present disclosure relates to a substrate treating apparatus and more particularly, to a substrate treating apparatus using plasma.

BACKGROUND

In fabricating semiconductor devices, substrates are formed with designed patterns through a variety of processes such as photolithography, etching, ashing, ion injection, thin film deposition, and washing. An etching process is generally used for remove specific areas from films formed on substrates. The etching is usually classified into dry etching and wet etching. Dry etching is performed to employ a plasma etching apparatus. Plasma is typically generated by forming an electromagnetic field in a chamber. Such a electromagnetic field operates to excite a processing gas, which is supplied into the chamber, to a plasma state.

Plasma is referred to an ionic gaseous state formed of ions, electrons, or radicals. Plasma is generated under very high temperature, strong electric fields, or RF electromagnetic fields. Semiconductor device fabrication is performed along with etching processes using plasma. An etching process is performed by colliding ionic particles, which are contained in plasma, against a substrate.

An electrostatic chuck generally includes a supporting plate and a metallic body. The supporting plate is bonded to the metallic body through an organic bonder such as silicon or acryl. However, silicon is high in thermal tolerance but low in thermal resistance. Therefore, silicon is stable even to heat generating during substrate treatment, but insufficient to interrupt thermal transfer between the metallic body and the supporting plate. Acryl is high in thermal resistance but low in thermal tolerance. Acryl is effective in preventing heat loss between the supporting plate and the metallic body, but damageable due to heat generated during substrate treatment.

As introduced above, organic bonders used in substrate treatment nowadays are disadvantageous to endurance and weak to elevation of processing temperature, due to thermal fluctuation of electrostatic chucks, and could be melted down during high temperature processes.

SUMMARY

Aspects of the present disclosure are to address at least the above-mentioned problems and/or disadvantages and to provide at least the advantages described below. Accordingly, an aspect of the present disclosure is to provide a supporting unit with high thermal tolerance in an electrostatic chuck used for substrate treatment, a fabrication method thereof, and a substrate treating apparatus including the supporting unit.

Another aspect of the present disclosure is to provide a supporting unit capable of securing interfacial stability which brazing a non-conductive supporting plate with a conductive composite base plate in an electrostatic chuck used for substrate treatment, a fabrication method thereof, and a substrate treating apparatus including the supporting unit.

Still another aspect of the present disclosure is to provide a supporting unit capable of preventing a defect due to deficiency of conductive material while brazing a non-conductive supporting plate with a conductive composite base plate in an electrostatic chuck used for substrate treatment, a fabrication method thereof, and a substrate treating apparatus including the supporting unit.

In accordance with an aspect of the present disclosure, a fabrication method of a supporting unit supporting a substrate may include providing a supporting plate that is made of a non-conductive material and configured to support the substrate, providing a base plate that is disposed under the supporting plate and made of a material containing a conductive material, and forming a metal film on a bottom surface of the base plate and bonding the supporting plate with the base plate through a brazing process.

In accordance with an aspect of the present disclosure, a fabrication method of a supporting unit supporting a substrate may include providing a supporting plate that is made of a non-conductive material and configured to support the substrate, providing a base plate that is disposed under the supporting plate and made of a material containing a conductive material, and forming a first metal film on a top surface of the base plate and bonding the supporting plate with the base plate through a brazing process.

Additionally, the fabrication method may further include depositing a second metal film, which is made of the same material with the first metal film, on a bottom surface of the supporting plate before the brazing process.

Additionally, the fabrication method may further include bonding the supporting plate with the base plate through an intermediate that is a metal plate for buffering thermal expansion.

Additionally, the metal plate may contain aluminum (Al) and may be formed in a mesh.

Additionally, the fabrication method may further include bonding the supporting plate with the base plate through an intermediate that is a metal filler.

Additionally, the metal filler may contain aluminum (Al).

Additionally, the first metal film and the second metal film may contain aluminum (Al).

Additionally, the fabrication method may further include depositing the second metal film on a third metal film that is deposited on the bottom surface of the supporting plate.

Additionally, the third metal film may contain titanium (Ti).

Additionally, the base plate may be provided with a conductive composite, in which an additive is mixed with the conductive material, to minimize thermal stress due to a difference of thermal expansion rates between the base plate and the supporting plate, wherein the conductive material may contain aluminum (Al), and wherein the additive may contain one of silicon carbide (SiC), aluminum oxide (Al2O3), silicon (Si), graphite, and glass fiber.

Additionally, the conductive composite may contain aluminum (Al) in 10~40%.

In accordance with an aspect of the present disclosure, a supporting unit may include a supporting plate of a non-conductive material including an electrode that adsorbs a substrate by an electrostatic force, and a base plate placed under the supporting plate, connected with a high-frequency power source, and bonded to the supporting plate through a brazing process, having a top surface on which a first metal film is deposited.

Additionally, the supporting plate may have a bottom surface on which a second metal film of the same material with the first metal film is deposited.

Additionally, the second metal film may be deposited in a third metal film deposited on the bottom surface of the supporting plate, and the third metal film may contain titanium (Ti).

Additionally, the base plate may be provided with a conductive composite in which one of silicon carbide (SiC), aluminum oxide (Al2O3), silicon (Si), graphite, and glass fiber is added to aluminum (Al), that is a conductive material, for minimizing thermal stress due to a difference of thermal expansion rates between the supporting plate and the base plate, and the conductive composite may contain the conductive material of 10~40%.

Additionally, the supporting unit may further include a bonding part interposed between the metal film and the base plate and configured to fix the metal film and the base plate through a metal plate that is used as an intermediate.

Additionally, the bonding part may be formed of a filler into which a metal mesh is inserted.

In accordance with an aspect of the present disclosure, a substrate treating apparatus may include a chamber configured to have a treating space, a supporting unit placed in the chamber and configured to support a substrate, a gas supply unit configured to supply a processing gas into the treating space, and a plasma source configured to generate plasma from the processing gas, wherein the supporting unit may include a base plate connected with a high-frequency power source and configured to have a top surface on which a first metal film is deposited, and a non-conductive supporting plate placed on the base plate, configured to include an electrode adsorbing the substrate by an electrostatic force, configured to have a bottom surface on which a second metal film of the same material with the first metal film is deposited, the supporting plate being bonded with the base plate through a brazing process.

Additionally, the base plate may be provided with a conductive composite in which one of silicon carbide (SiC), aluminum oxide (Al2O3), silicon (Si), graphite, and glass fiber is added to a conductive material, for minimizing thermal stress due to a difference of thermal expansion rates between the supporting plate and the base plate, and the conductive composite may contain the conductive material of 10~40%.

Additionally, the substrate treating apparatus may further include a metal plate interposed between the base plate and the supporting plate and configured to bond the supporting plate with the base plate through a brazing process.

Additionally, the substrate treating apparatus may further include a metal filler interposed between the base plate and the supporting pate and configured to bond the supporting plate with the base plate through a brazing process.

According to an embodiment of the present disclosure, it may be accomplishable to provide a supporting unit with high thermal tolerance.

According to an embodiment of the present disclosure, it may be possible to minimize thermal stress which is caused from a difference of thermal expansion rates between a supporting plate and base plate, thus preventing the supporting plate from breakage, bending, or other damages.

According to an embodiment, it may be particularly effective for a first metal film to prevent instability arising from a base plate which decreases in contents of conductive material less than 50% to minimize a bending effect due to a difference of thermal expansion rates between a supporting plate and a base plate.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
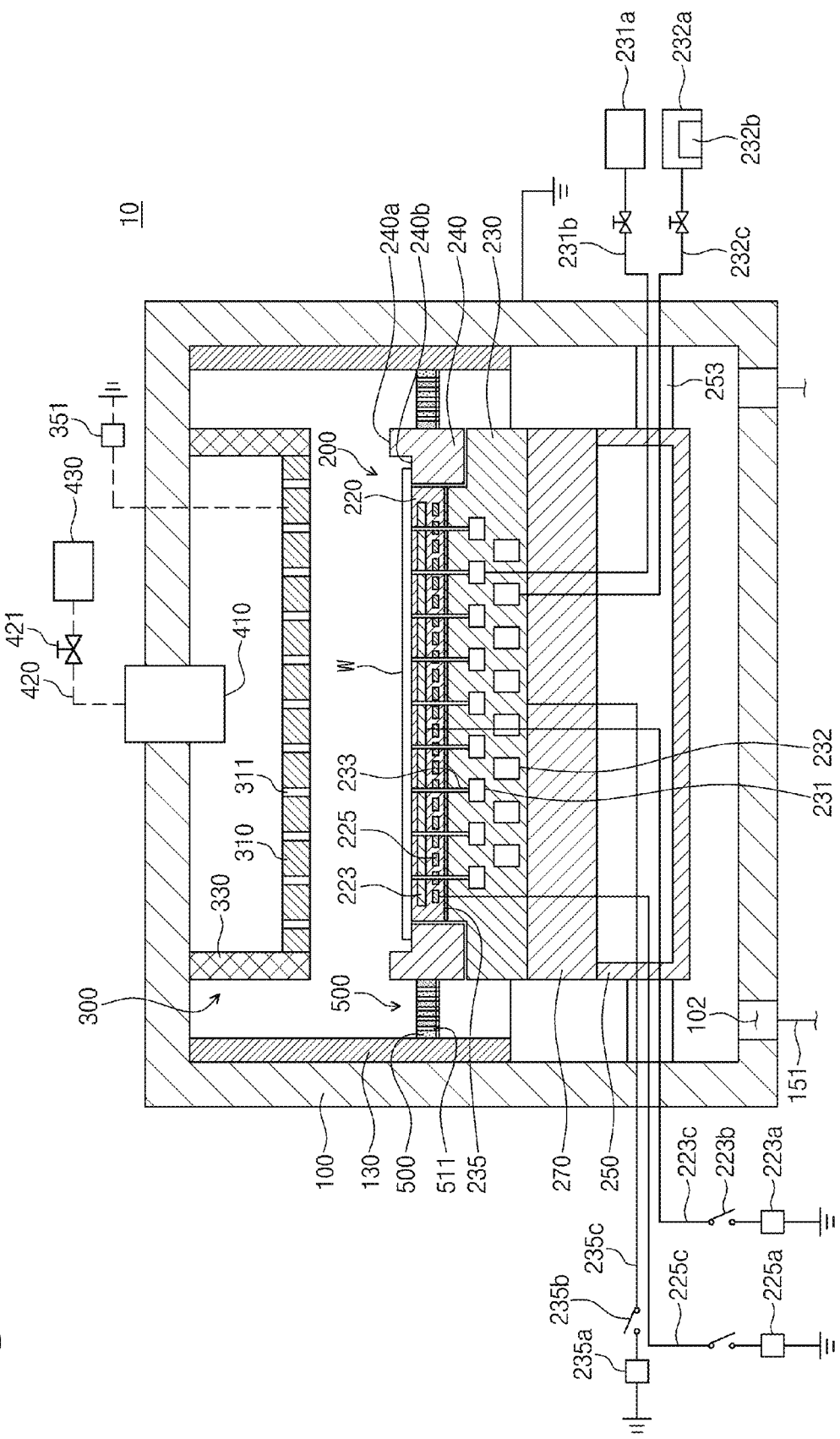
FIG. 1 is a sectional diagram illustrating a substrate treating apparatus according to an embodiment of the present disclosure.

Hereinafter, various embodiments of the present disclosure will be described in conjunction with the accompanying drawings. Various embodiments described herein, however, may not be intentionally confined in specific embodiments, but should be construed as including diverse modifications, equivalents, and/or alternatives. With respect to the descriptions of the drawings, like reference numerals refer to like elements.

FIG. 1 is a sectional diagram illustrating a substrate treating apparatus according to an embodiment of the present disclosure.

Referring to FIG. 1, a substrate treating apparatus 10 may treat a substrate W with plasma. For example, the substrate treating apparatus 10 may perform several processes such as etching, washing, ashing, and so on. The substrate treating apparatus 10 may include a chamber 100, a supporting unit 200, a plasma source 300, a gas supply unit 400, and a baffle unit 500.

The chamber 100 may provide a space for treating substrates. The chamber 100 may include an internal closed space for treating substrates. The chamber 100 may be made of metal. The chamber 100 may be made of aluminum. The chamber 100 may be grounded. The chamber may have an exhaust hole 102 at the bottom. The exhaust hole 102 may be connected with an exhaust line 151. Byproducts generated during processes and gas staying in the internal space of the chamber may be discharged outward through the exhaust line 151. Exhaustion may condition the internal space of the chamber 100 to go down into specific pressure.

In an embodiment, the chamber 100 may internally include a liner 130. The liner 130 may be shaped in a cylinder which is opened upward and downward. The liner 130 may be provided to be in contact with the inner surface. The liner 130 may protect the inner wall of the chamber 100 from arc discharge. Additionally, the liner 130 may prevent particles, which are generated during substrate treatment, from being deposited on the inner wall of the chamber 100. Alternatively, the liner 130 may not be provided in the chamber 100.

The supporting unit 200 may be placed in the chamber 100. The supporting unit 200 may support the substrate W. The supporting unit 200 may include an electrostatic chuck 210 for adsorbing the substrate W with an electrostatic force. Otherwise, the supporting unit 200 may use other mechanisms such as mechanical clamping to support the substrate W. The supporting unit 200 including the electrostatic chuck 210 will be described in more detail hereinbelow.

The supporting unit 200 may include the electrostatic chuck 210, a bottom cover 250, and a plate 270. The supporting unit 200 may be isolated upward from the bottom of the chamber 100 in the chamber 100.

The electrostatic chuck 210 may include a supporting plate 220 and a base plate 230.

The supporting plate 220 may be provided to the top of the electrostatic chuck 210.

The supporting plate 220 may be formed of a non-conductive material. A metal film 226 may be deposited on the bottom surface of the supporting plate 220. Otherwise, the supporting plate 220 may be formed of a composite with a conductive material and other additives. In an embodiment, the supporting plate 220 may include a circular dielectric substance. The substrate W may be placed on the top surface of the supporting plate 220. The top surface of the supporting plate 220 may be smaller than the substrate W in radius. Therefore, a heating edge of the substrate W may be placed at the outside of the supporting plate 220.

Figure 2:
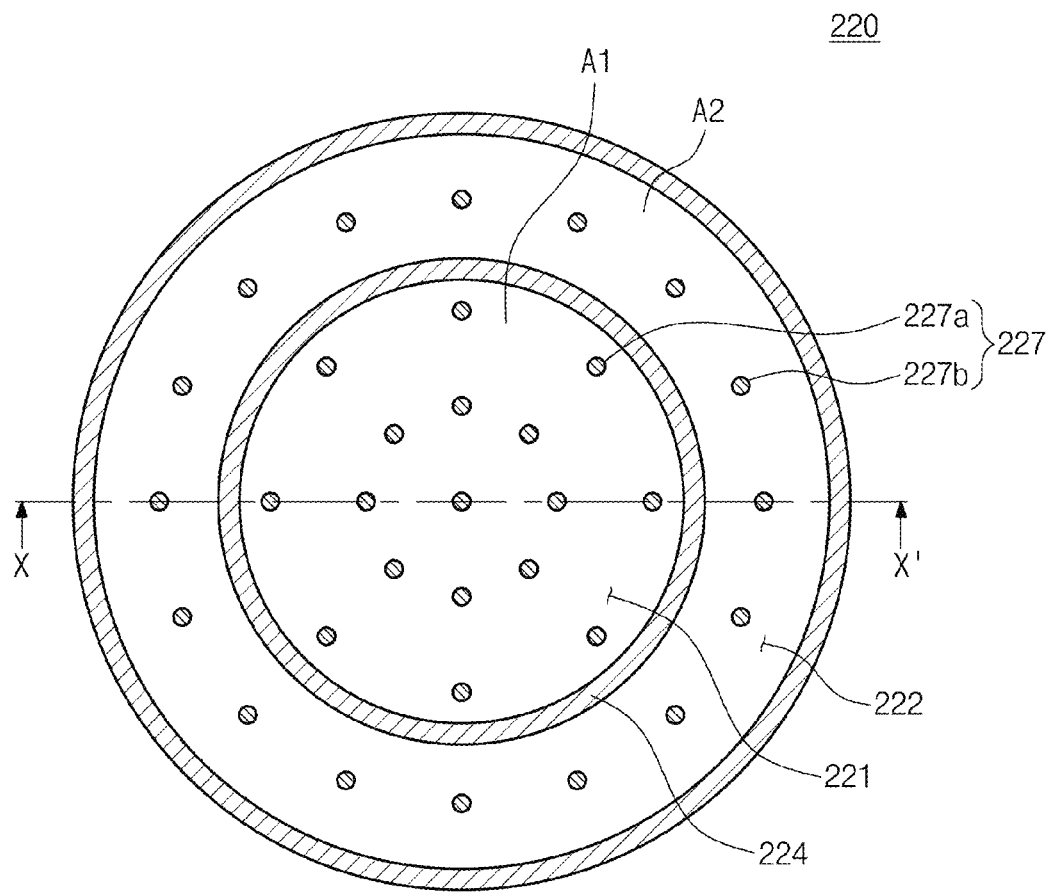
FIG. 2 is a plan diagram illustrating a supporting plate of the supporting unit shown in FIG. 1.
Figure 3:
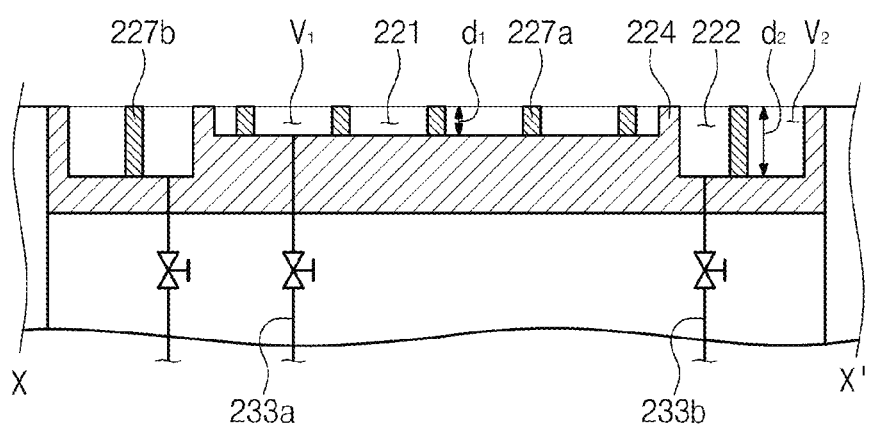
FIG. 3 is a sectional diagram illustrating the supporting plate of the supporting unit taken along X-X' of FIG. 2.

FIG. 2 is a plan diagram illustrating a supporting plate of the supporting unit shown in FIG. 1, and FIG. 3 is a sectional diagram illustrating the supporting plate of the supporting unit taken along X-X' of FIG. 2.

Referring to FIGS. 2 and 3, a supporting plate 220 may include an inner groove 221, an outer groove 222, a sill 224, projections 227, and a second flow path 233. The inner groove 221 may be placed at the top center of the supporting plate 220. The inner groove 221 may be provided with a circular form in the top sight. The inner groove 221 may be provided with a first depth d1.

Additionally, the inner groove 221 may be provided with a first area A1 in the top sight. The inner groove 221 may be provided with first volume V1. The first volume V1 means the volume occupied by a heat transfer gas in the inner groove 221. Accordingly, the first volume V1 means volume which is obtained by subtracting the projections 227, which are located in the inner groove 221, from the inner groove 221 in volume.

The outer groove 222 may be provided with a ring in the top sight. The outer groove 222 may surround the inner groove 221. The outer groove 222 may be provided with a second depth d2. The second depth d2 of the outer groove 222 may be different from the first depth d1 of the inner groove 221. Otherwise, the second depth d2 of the outer groove 222 may be same with the first depth d1 of the inner groove 221.

The outer groove 222 may have a second area A2 in the top sight. The second area A2 of the outer groove 222 may be wider than the first area A1 of the inner groove 221. Otherwise, the second area A2 of the outer groove 222 may be same with the first area A1 of the inner groove 221. The outer groove 222 may be provided with second volume V2. The second volume V2 means the volume occupied by a heat transfer gas in the outer groove 222. Accordingly, the second volume V2 means volume which is obtained by subtracting the projections 227, which are located in the outer groove 222, from the outer groove 222 in volume. In an embodiment, the second volume V2 of the outer groove 222 may be different from the first volume V1 of the inner groove 221. Otherwise, the second volume V2 of the outer groove 222 may be same with the first volume V1 of the inner groove 221.

The sill 224 may be provided between the inner groove 221 and the outer groove 222. The sill 224 may act as a border defining the inner groove 221 and the outer groove 222. The sill 224 may be provided with a height on the same level with the top ends of the supporting plate 220 and the projections 227.

The projections 227 may be provided in the inner groove 221 and the outer groove 222. The projections 227 may be provided in plurality. The projections 227 may include first projections 227a and second projections 227b. The first projections 227a may be placed in the inner groove 221. The first projections 227a may be provided in plurality. A plurality of the first projections 227a may be arranged in a specific interval each other. The first projections 227a may be arranged in the same with the first depth d1 of the inner groove 221. The first projections 227a may be provided with a height on the same level with the top end of the sill 224.

The second projections 227b may be placed in the outer groove 222. The second projections 227b may be provided in plurality. A plurality of the second projections 227b may be arranged in a specific interval each other. The second projections 227b may be arranged in the same with the second depth d2 of the outer groove 222. The second projections 227b may be provided with a height on the same level with the top end of the sill 224.

The second flow path 233 may supply a heat transfer gas to the bottom surface of the substrate W. The second flow path 233 may supply a heat transfer gas to the inner groove 221 and the outer groove 222. The second flow path 233 may be connected with the inner groove 221 and the outer groove 222. In an embodiment, the second flow path 233 may include an inner second flow path 233a and an outer second flow path 233b. The inner second flow path 233a may be connected with the inner groove 221 to supply a heat transfer gas into the inner groove 221. The outer second flow path 233b may be connected with the outer groove 222 to supply a heat transfer gas into the outer groove 222.

A heat transfer gas may act as a heat transfer medium between the substrate W and the supporting unit 200. A heat transfer gas may be provided with a fluid with high thermal conductivity to help heat transfer between the substrate W and the supporting unit 200. An amount of heat transfer gas supplied to the top surface of the supporting unit 200 may be controlled to adjust temperature of the substrate W. As aforementioned, it may be practicable to adjust an amount of heat transfer gas between the substrate W and the supporting unit 200 by providing a plurality of grooves on the top surface of the supporting unit 200 in different depths, widths, and volume. Accordingly, it may be possible to easily control temperature according to areas of the substrate W. In an embodiment, a heat transfer gas may contain helium (He) gas.

Returning to FIG. 1, the supporting plate 220 may further include a first electrode 223 and a heater 225 which are laid therein.

The first electrode 223 may be electrically connected with a first power source 223a. The first power source 223a may include a direct-current (DC) power source. A switch 223b is interposed between the first electrode 223 and the first power source 223a. The first electrode 223 may be electrically connected with the first power source 223a through an on/off operation of the switch 223b. If the switch is turned on, a DC may be applied to the first electrode 223. A current applied to the first electrode 223 induces an electrostatic force between the first electrode 223 and the substrate W. This electrostatic force makes the substrate W adsorbed to the supporting plate 220.

The heater 225 may be placed under the first electrode 223. The heater 225 may be electrically connected with a second power source 225a. The heater 225 may generate heat by resisting a current which is supplied from the second power source 225a. The generated heat may be transferred to the substrate W through the supporting plate 220. The substrate W may be maintained at specific temperature by heat generated from the heater 225. The heater 225 may include spiral coils.

The base plate 230 may be placed under the first electrode 223. The bottom surface of the supporting plate 220 and the top surface of the base plate 230 may be bonded each other by brazing through a filler 235 as an intermediate. The base plate 230 may include a conductive material. In an embodiment, the base plate 230 may be provided with aluminum. The base plate 230 may include an electrode. The top surface of the base plate 230 may be formed to have a step by which the center heating area is leveled higher than the edge heating area. The top center heating area of the base plate 230 may correspond to the bottom surface of the supporting plate 220 and may be contact with the bottom surface of the supporting plate 220. The base plate 230 may be formed with a recycling flow path 231, a cooling member 232, and the second flow path 233.

The recycling flow path 231 may provide a passage for recycling a heat transfer medium. The recycling flow path 231 may be spirally formed in the base plate 230. Otherwise, the recycling flow path 231 may be configured in ring-shaped flow paths which have the same center but different in radius. The recycling flow paths 231 may be connected through each other. The recycling flow paths 231 may be leveled on the same height.

The cooling member 232 may cool down the body. The cooling member 232 may provide a passage through which a cooling fluid is recycled. The cooling member 232 may be spirally formed in the base plate 230. Additionally, the cooling member 232 may be configured in ring-shaped flow paths which have the same center but different in radius. The cooling members 232 may be connected through each other. The cooling member 232 may be larger than the recycling flow path 231 in cross sectional area. The cooling members 232 may be leveled on the same height. The cooling member 232 may be placed under the recycling flow path 231.

The second flow path 233 may extend upward from the recycling flow path 231 to the top surface of the base plate 230. The second flow path 233 may be provided corresponding to the recycling flow path 231 in number.

The recycling flow path 231 may be connected with a heat-transfer medium reservoir 231a. The heat-transfer medium reservoir 231a may store a heat transfer medium. A heat transfer medium may contain an inert gas. According to an embodiment, a heat transfer medium may contain helium (He) gas. Helium gas may be supplied into the recycling flow path 231 through a supply line 231b and may be supplied to the bottom surface of the substrate W through the second flow path 233, the inner groove 221, and the outer groove 222. Helium gas may act as a medium for transferring heat, which is transferred to the substrate W from plasma, to the electrostatic chuck 210.

The cooling member 232 may be connected with a cooling fluid reservoir 232a through a cooling fluid supply line 232c. The cooling fluid reservoir 232a may store a cooling fluid. The cooling fluid reservoir 232a may include a cooler 232b. The cooler 232b may cool down a cooling fluid to specific temperature. Otherwise, the cooler 232b may be installed on the cooling fluid supply line 232c. A cooling fluid supplied to the cooling member 232 through the cooling fluid supply line 232c may be recycled along the cooling member 232 to cool down the base plate 230. The base plate 230 may be cooled down together with the supporting plate 220 and the substrate W, and thereby the substrate W may be maintained at specific temperature.

The base plate 230 may include a metal plate. According to an embodiment, the base plate 230 may be entirely formed of a metal plate. The base plate 230 may be electrically connected with a third power source 235a. The third power source 235a may be provided as a high-frequency power source for generating high frequency power. The high frequency power source may be provided as an RF power source. High frequency power may be applied to the base plate 230 from the third power source 235a. Therefore, the base plate 230 may function as an electrode.

A focus ring 240 may be disposed at the edge of the electrostatic chuck 210. The focus ring 240 may be shaped in a ring and may be disposed along the circumference of the supporting plate 220. The top surface of the focus ring 240 may have a step by which an outer part 240a is higher than a top inner part 240b. The top inner part of the focus ring 240 may be leveled on the same height of the top surface of the supporting plate 220. The top inner part 240b of the focus ring 240 may support the edge of the substrate W which is placed at the outside of the supporting plate 220. The outer part 240a may be provided to surround the edge of the substrate W. The focus ring 240 may control an electromagnetic field to uniform plasma density throughout the whole area of the substrate W. Accordingly, plasma may be uniformly formed throughout the whole area of the substrate W and thereby the substrate W may be uniformly etched in each area.

The bottom cover 250 may be placed under the supporting unit 200. The bottom cover 250 may be isolated upward from the bottom surface of the chamber 100. The bottom cover 250 may have an internal space which is open upward. The outer radius of the bottom cover 250 may be same with that of the base plate 230. The internal space of the bottom cover 250 may accommodate a lift pin module (not shown) which moves the substrate W to the electrostatic chuck 210 from an external carrying member. The bottom surface of the bottom cover 250 may be made of a metal.

The bottom cover 250 may have a linking member 253. The linking member 253 may link the outer surface of the bottom cover 250 with the inner wall of the chamber 100. The linking member 253 may be provided in plurality with a specific internal on the outer surface of the bottom cover 250. The linking member 253 may support the supporting unit 200 in the chamber 100. Additionally, the linking member 253 may be connected with the inner wall of the chamber 100 to allow the bottom cover 250 to be electrically grounded. A first power line 223c connected with the first power source 223a, a second power line 225c connected with the second power source 225a, a third power line 235c connected with the third power source 235a, a medium supply line 231b connected with the heat-transfer medium reservoir 231a, and a cooling-fluid supply line 232c connected with the cooling fluid reservoir 232a may extend into the inside of the bottom cover 250 through the inner space of the linking member 235.

The plate 270 may be interposed between the electrostatic chuck 210 and the bottom cover 250. The plate 270 may cover the top surface of the bottom cover 250. The plate 270 may correspond to the base plate 230 in cross sectional area. The plate 270 may include an insulation substance. The plate 270 may electrically insulate the base plate 230 from the bottom cover 250.

A plasma source may generate plasma from a processing gas. A plasma source may be provided in the form of Capacitively Coupled Plasma (CCP) or Inductively Coupled Plasma (ICP).

The description will be hereinafter made as a substrate treating apparatus 10 according to embodiments of the present disclosure employs a CCP type for a plasma source. A plasma source may include a shower head 300. Otherwise, a plasma source may be formed in an ICP type.

The shower head 300 may be placed over the supporting unit 200 in the chamber 100. The shower head 300 may be opposite to the supporting unit 200.

The shower head 300 may include a gas distributing plate 310 and a supporting part 330. The gas distributing plate 310 may be isolated downward with a specific interval from the top surface of the chamber 100. The gas distributing plate 310 and the top surface of the chamber 100 may form a specific space between them. The gas distributing plate 310 may be provided in a plate with a specific thickness. The bottom surface of the gas distributing plate 310 may be anodized to prevent arc generation. The section of the gas distributing plate 310 may correspond to that of the supporting unit 200 in shape. The gas distributing plate 310 may include a plurality of injection holes 311. The injection holes 311 may vertically penetrate the top and bottom surfaces of the gas distributing plate 310. The gas distributing plate 310 may contain a metal. The gas distributing plate 310 may be electrically connected with a fourth power source 351. The fourth power source 351 may be provided as a high-frequency power source. Otherwise, the gas distributing plate 310 may be electrically grounded. The gas distributing plate 310 may act as an electrode in electrical connection with the fourth power source 351 or with the ground.

The supporting part 330 may support the side of the gas distributing plate 310. The top end of the supporting part 330 may be link with the top surface of the chamber 100 and the bottom end of the supporting part 330 may be link with the side of the gas distributing plate 310. The supporting part 330 may contain a non-metallic material.

The shower head 300 may act as an electrode in supply with power. The shower head 300 and the base plate 230 of the supporting unit 200 may be provided as an upper electrode and a lower electrode, respectively. The upper electrode and the lower electrode may be arranged up and down in parallel each other in the chamber 100. One of both electrodes may be applied with high frequency power while the other may be grounded. The space between both electrodes may be conditioned in an electromagnetic field and a processing gas supplied into the space may be excited in a plasma state. This plasma may be used for substrate treatment.

According to an embodiment, the lower electrode may be applied with high frequency power while the upper electrode may be grounded. Otherwise, the upper electrode and the lower electrode may be all applied with high frequency power. Due to this condition, an electromagnetic field is generated between the upper electrode and the lower electrode. This electromagnetic field may act to excite a processing gas, which is supplied into the chamber 100, to a plasma state.

The gas supply unit 400 may supply a processing gas into the chamber 100. The gas supply unit 400 may include a gas supply nozzle 410, a gas supply line 420, and a gas reservoir 430. The gas supply nozzle 410 may be installed at the top center of the chamber 100. The bottom surface of the gas supply nozzle 410 may be formed with an injector. The injector may supply a processing gas into the chamber 100. The gas supply line 420 may connect the gas supply nozzle 410 with the gas reservoir 430. The gas supply line 420 may supply a processing gas to the gas supply nozzle 410 from the gas reservoir 430. The gas supply line 420 may be installed with a valve 421. The valve 421 may open or close the gas supply line 420, and may adjust flux of a processing gas which is supplied through the gas supply line 420.

The baffle unit 500 may be placed between the supporting unit 200 and the inner wall of the chamber 100. The baffle unit 500 may include a baffle 510. A baffle 510 may be shaped in a ring. A plurality of through holes 511 may be formed in the baffle 510. A processing gas provided into the chamber 100 may pass the through holes 511 and may be discharged to the exhaust hole 102. The flow of a processing gas may be controlled by shapes of the baffle 510 and the through holes 511.

A fabrication method for the supporting unit of FIG. 1 will be described hereinbelow.

Figure 4:
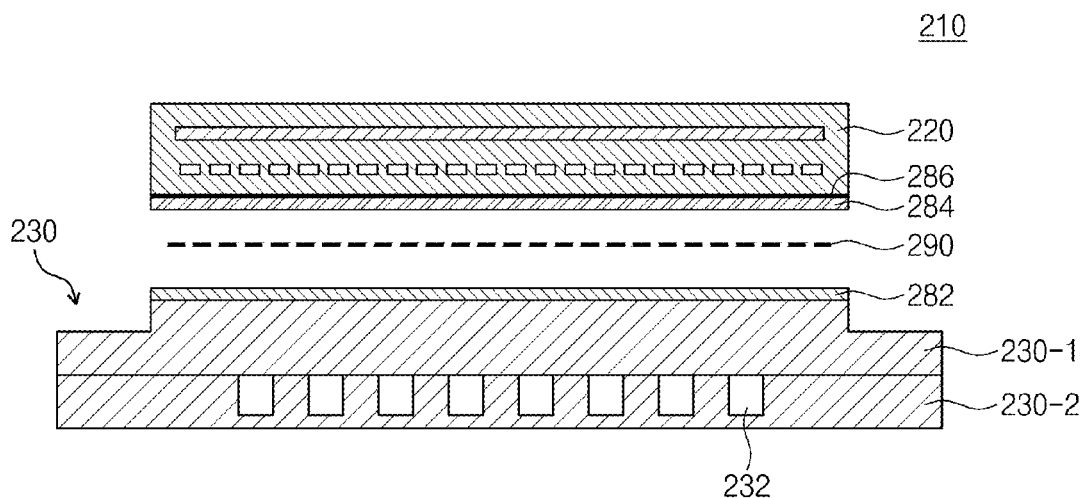
FIG. 4 is a divisional diagram schematically illustrating elements of the supporting unit shown in FIG. 1.
Figure 5:
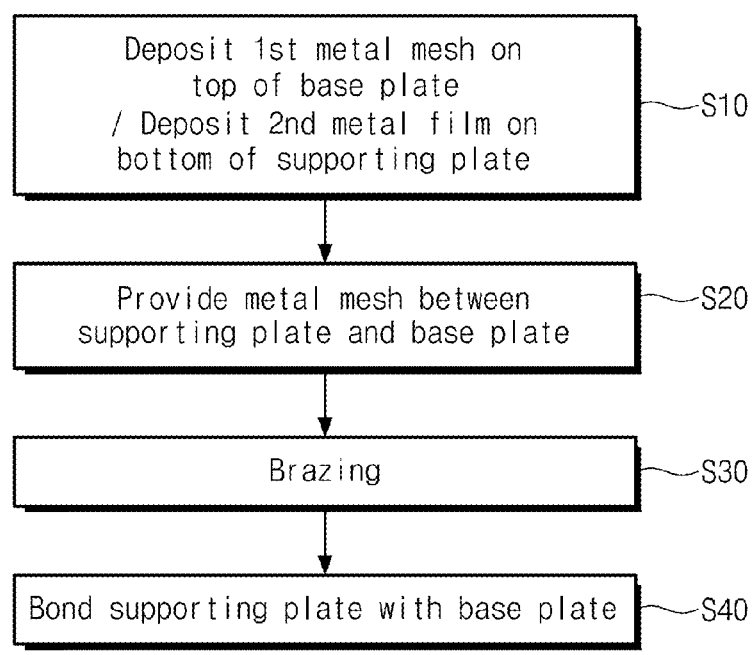
FIG. 5 is a flow chart showing a fabrication method for a supporting unit.

FIG. 4 is a divisional diagram schematically illustrating elements of a supporting unit shown in FIG. 1. FIG. 5 is a flow chart showing a fabrication method for a supporting unit.

Figure 6:
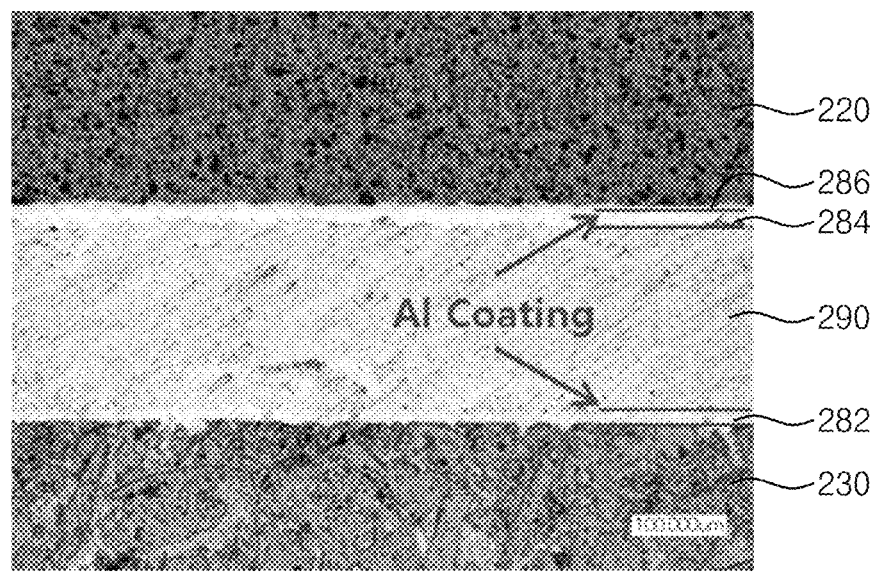
FIG. 6 is a photograph showing a microscopic structure of a bonding part between a supporting plate and a base plate which are bonded each other through the fabrication method of FIG. 5.

For convenience of illustration, grooves, a sill, projections, and flow paths, which are formed on the top surface of a supporting plate 220, are not shown in FIG. 4. Additionally, although FIG. 4 is illustrated as a first metal film and a second metal film are thicker than a metal mesh 290, it may be practicable for the metal mesh to be thicker than the first metal film and the second metal film as shown in FIG. 6.

An electrostatic chuck 210 of a supporting unit may include a supporting plate 220, a base plate 230, and a bonding part. The bonding part may be a bonding layer which is formed by a brazing process using a first metal film 282 and a second metal film 284, and the metal mesh 290 between the metal films as a bonding intermediate. Although this embodiment is illustrated and described as the bonding part includes the metal mesh 290, the bonding part may be provided even with a metal plate but the metal mesh.

To minimize thermal stress due to a difference of thermal expansion rates between the supporting plate 220 and the base plate 230, the base plate 230 may be provided with a conductive composite in which an additive is mixed with a conductive material. An additive may be made of a material which has a thermal expansion rate smaller than a difference of those between the conductive material and a material of the supporting plate. In an embodiment, a conductive material may contain titanium (Ti) or aluminum (Al), preferably aluminum (Al). An additive may contain one of silicon carbide (SiC), aluminum oxide (Al2O3), silicon (Si), graphite, glass fiber, and so on. In the case that a conductive material of aluminum (Al) is equal to or larger than 50% in content, a conductive composite may be insufficient to manufacture an electrostatic chuck due to a bending effect by a difference of thermal expansion rates. In the case that a conductive material of aluminum (Al) is less than 50% (preferably 10~40%), a conductive composite may be insufficient to form a stable brazing result due to deficiency of Al content which acts as a source material of the brazing. To solve such a problem, in the base plate 230 according to embodiments of the present disclosure, a brazing process with the first metal film 282 of aluminum (Al) may be performed to obtain a stable brazing interface (S10).

As aforementioned, by manufacturing the base plate 230 with a conductive composite containing aluminum (Al) which is less than 10~40% in content and then by forming the first metal film 282 on the top surface of the first metal film 282, it may be allowable to lessen thermal stress which is caused from a difference of thermal expansion rates between the supporting plate 220 and the base plate 230, when a brazing process is performed to bond the supporting plate 220 with the base plate 230, and to provide a stable brazing interface by the first metal film 282. In this manner, thermal stress due to a difference of thermal expansion rates between the supporting plate and the base plate can be reduced to prevent the supporting plate 220 from being broken or bent due to the thermal expansion rate difference.

In the meantime, the base plate 230 may be independently manufactured into an upper base plate 230-1 and a lower base plate 230-2, for providing a cooling member 232 as a passage through which a cooling fluid is recycled, and then the upper base plate 230-1 and the lower base plate 230-2 may be bonded each other by a brazing process. Temperature for brazing the upper base plate 230-1 and the lower base plate 230-2 may be higher than that for brazing the base plate 230 and the supporting plate 220.

The second metal film 284 may be deposited on the bottom surface of the supporting plate 220 which is made of a non-conductive material (S10). The second metal film 284 may be provided in the same material with the first metal film 282. The supporting plate 220 may include a third metal film 286 between the second metal film 284 and the bottom surface of the supporting plate 220. The third metal film 286 may be deposited on the bottom surface of the supporting plate 220 through vacuum evaporation or plating before the second metal film 284 is deposited thereon. The third metal film 286 may be made of titanium (Ti), but may be made of nickel (Ni) or argentum (Ag).

In the meantime, the metal mesh 290 may be provided between the supporting plate 220 and the base plate 230 which is made of a conductive material (S20). In an embodiment, the metal mesh 290 may have a porous rate of 20~80%. The metal mesh 290 may contain aluminum (Al). A brazing process may be performed employing the metal mesh 290 as an intermediate (S30).

In a brazing process, the metal mesh 290 may be inserted between the supporting plate 220 and the base plate 230, which are to be bonded, may be heated up to temperature enough to melt a metal thereof and cooled down, and then may be cooled down to form a strong bonding part as shown in FIG. 6. The supporting plate 220 and the base plate 230 are bonded each other through the brazing process (S40). As the supporting plate 220 is bonded with the base plate 230, the electrostatic chuck 210 may be characterized in high thermal tolerance under a high temperature process.

Although the aforementioned description is about a bonding between the supporting plate 220 and the base plate 230 through a brazing process, the supporting plate 220 and the base plate 230 may be boned each other through other various ways. In an embodiment, a bonding layer may be provided between the supporting plate 220 and the base plate 230.

In another embodiment, the supporting plate 220 and the base plate 230 may be bonded each other, without the bonding part and the first metal film of the base plate 230, under the condition of depositing the second metal film 284 on the bottom surface of the supporting plate 220.

Figure 7:
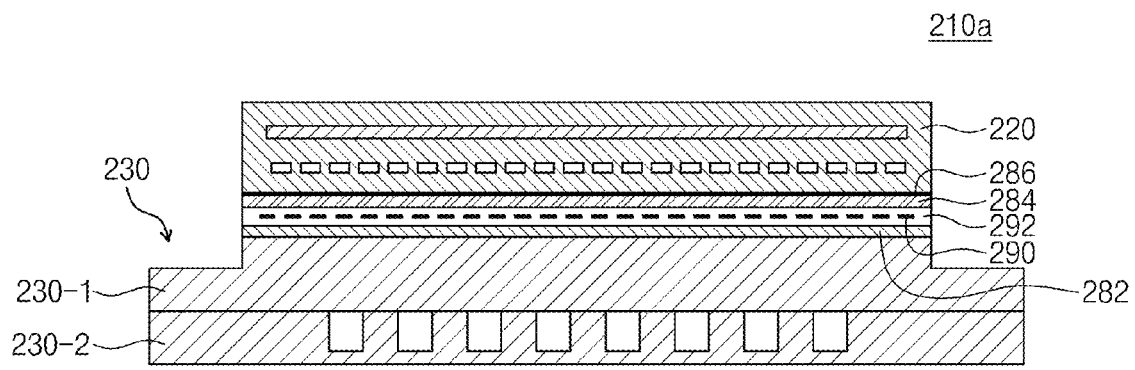
FIG. 7 is a sectional diagram illustrating a modification of an electrostatic chuck.

FIG. 7 is a sectional diagram illustrating a modification of an electrostatic chuck.

An electrostatic chuck 210a illustrated in FIG. 7 may include a supporting plate 220, a base plate 230, and a bonding part. The boding part may be bonded thereto by a brazing process accompanying a filler 292 as an intermediate, which is different from the aforementioned electrostatic chuck that a metal mesh 290 is inserted into the filler 292.

Although in this embodiment the bonding part is configured such that the metal mesh 290 is inserted into the filler 292, an electrostatic chuck may be otherwise may be formed in a bonding structure, without the filler 292 as an intermediate, through a solid-state diffusion brazing process using a material (aluminum) such as a buffer metal layer, without such an additional filler, between a first metal film 282 of the base plate 230 and a second metal film 284 of the supporting plate 220.

While embodiments of the present disclosure have been shown and described with reference to the accompanying drawings thereof, it will be understood by those skilled in the art that various changes and modifications in form and details may be made therein without departing from the spirit and scope of the present disclosure as defined by the appended claims and their equivalents. For example, it may be allowable to achieve the desired results although the embodiments of the present disclosure are preformed in dispersed forms with the elements disclosed on the embodiments of the present disclosure, or in combinational forms with the elements. Therefore, the technical scope of the present disclosure should be almost defined by the inventive concept of the appended claims, but without literally restrictive to the claims, and should be construed as including other implementations, other embodiments, and equivalents of the appended claims.

What is claimed is:

1. A fabrication method of a supporting unit supporting a substrate, the fabrication method comprising:
   providing a supporting plate, the supporting plate made of a non-conductive material and configured to support the substrate;
   providing a base plate, the base plate under the supporting plate and made of a material containing a conductive material, the providing a base plate including providing an upper base plate part and providing a lower base plate part to be bonded onto a bottom surface of the upper base plate part through a first brazing process;
   forming a first metal film on a top surface of the base plate;
   forming a second metal film on a bottom surface of the supporting plate;
   providing a metal mesh between the first and second metal films; and
   performing a second brazing process with regard to the first metal film, the second metal film, and the metal mesh to form a bonding intermediate that bonds the supporting plate with the base plate, wherein a temperature of the first brazing process is higher than a temperature of the second brazing process.

2. The fabrication method of claim 1, wherein the first metal film is made of a same material as the second metal film.

3. The fabrication method of claim 1, wherein the bonding intermediate is a metal plate for buffering thermal expansion.

4. The fabrication method of claim 3, wherein the metal plate contains aluminum (Al).

5. The fabrication method of claim 1, further comprising: forming a metal filler between the first metal film and the second metal film to enclose the metal mesh therein.

6. The fabrication method of claim 5, wherein the metal filler contains aluminum (Al).

7. The fabrication method of claim 2, wherein the first metal film and the second metal film contain aluminum (Al).

8. The fabrication method of claim 2, further comprising: forming a third metal film between the second metal film and the bottom surface of the supporting plate.

9. The fabrication method of claim 8, wherein the third metal film contains titanium (Ti).

10. The fabrication method of claim 1, wherein
the providing a base plate provides the base plate made of a conductive composite, which is a mixture of an additive and the conductive material, to minimize thermal stress due to a difference of thermal expansion rates between the base plate and the supporting plate,
the conductive material contains aluminum (Al), and
the additive contains one of silicon carbide (SiC), aluminum oxide ($Al_2O_3$), silicon (Si), graphite, and glass fiber.

* * * * *